(12) United States Patent
Stockinger

(10) Patent No.: US 9,293,451 B2
(45) Date of Patent: Mar. 22, 2016

(54) INTEGRATED CIRCUIT ELECTRICAL PROTECTION DEVICE

(71) Applicant: Michael A. Stockinger, Austin, TX (US)

(72) Inventor: Michael A. Stockinger, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 196 days.

(21) Appl. No.: 13/682,558

(22) Filed: Nov. 20, 2012

(65) Prior Publication Data

US 2014/0139957 A1 May 22, 2014

(51) Int. Cl.
*H02H 3/20* (2006.01)
*H01L 27/02* (2006.01)
*H01L 27/06* (2006.01)

(52) U.S. Cl.
CPC ........ *H01L 27/0277* (2013.01); *H01L 27/0629* (2013.01)

(58) Field of Classification Search
USPC ........................................................ 257/355
See application file for complete search history.

(56) References Cited

U.S. PATENT DOCUMENTS

| | | | |
|---|---|---|---|
| 6,411,480 B1 | 6/2002 | Gauthier et al. | |
| 6,661,273 B1 | 12/2003 | Lai et al. | |
| 6,933,567 B2 | 8/2005 | Duvvury et al. | |
| 7,193,274 B2 | 3/2007 | Liu et al. | |
| 7,746,607 B2 | 6/2010 | Gauthier, Jr. et al. | |
| 2005/0029540 A1* | 2/2005 | Kodama et al. | 257/173 |
| 2005/0242399 A1* | 11/2005 | Huang | H01L 21/823418 257/355 |
| 2009/0009916 A1* | 1/2009 | Ker et al. | 361/56 |
| 2012/0286355 A1* | 11/2012 | Mauder | H01L 21/0228 257/330 |

OTHER PUBLICATIONS

Amerasekera et al.; "Substrate Triggering and Salicide Effects on ESD Performance and Protection Circuit Design in Deep Submicron Cmos Processes"; IEDM 95; 1995; pp. 547-550; IEEE.
Duvvury et al.; "Substrate Pump NMOS for ESD Protection Applications"; EOS/ESD Symposium; 2000;pp. 7-17; IEEE.
Ker et al., "Self-Substrate-Triggered Technique to Enhance Turn-On Uniformity of Multi-Finger ESD Protection Devices"; IEEE Journal of Solid-State Circuits, vol. 41, No. 11, Nov. 2006, pp. 2601-2609.
Huh et al., "The Effects of Substrate Coupling on Triggering Uniformity and ESD Failure Threshold of Fully Silicided NMOS Transistors"; 2002 Symposium on VLSI Technology, 2002, Digest of Technical Papers, pp. 220-221.

* cited by examiner

*Primary Examiner* — Zandra Smith
*Assistant Examiner* — Lawrence Tynes, Jr.

(57) ABSTRACT

An integrated circuit electrical protection device includes a semiconductor substrate, and first, second, and third doped regions of a first polarity in the semiconductor substrate. The first and second doped regions are separated from one another by a first body region having a second polarity and the second and third doped regions are separated from one another by a second body region having the second polarity. The first and second polarities are different from one another. A fourth doped region of the second polarity directly abutting and in contact with the third doped region. A first gate structure is formed over the first body region between the first and second doped regions. A second gate structure is formed over the second body region between the second and third doped regions.

20 Claims, 4 Drawing Sheets

US 9,293,451 B2

INTEGRATED CIRCUIT ELECTRICAL PROTECTION DEVICE

BACKGROUND

1. Field

This disclosure relates generally to electrical protection, and more particularly to electrical protection for an integrated circuit.

2. Related Art

An integrated circuit (IC) may be subject to a high voltage event that may overstress the integrated circuit and that can be destructive. An electrostatic discharge (ESD) event is such an overstress event that can be destructive in the manufacturing process, during assembly and testing, or in the system application. Some on-chip ESD protection networks use an active MOSFET (metal oxide semiconductor field-effect transistor) rail clamp protection scheme with large ESD diodes between the input/output (I/O) pads and the power supply rails. This approach has been effective but the currents involved can be quite large so the MOSFET must accordingly be large which is accomplished using many transistors in parallel. One of the mechanisms that is very useful in providing the protection is that an inherent bipolar device, which may be called a bipolar junction transistor (BJT), becomes functional by a mechanism commonly referenced as snap-back. This may occur due to a large voltage between the drain and the source and a change in the potential in the body region that causes the source-body junction diode of the MOSFET to turn on. The potential change in the body region can, for example, be due to drain-body junction leakage current causing a voltage drop along the resistive path from the body region of the MOSFET to the body contact. Once the source-body diode is turned on, current starts flowing between the drain and the source due to the inherent BJT device with the drain as the collector. The large collector current can cause impact ionization current adding to the already flowing drain-body junction leakage current, further turning on the bipolar device. This may ultimately result in the snap-back, which is non-destructive if the high current is for a very short duration. The snap-back results in a significant increase in the current that is provided between the source and drain because much of the current being carried is down in the body region well below the MOSFET channel. Thus, the snap-back is relied upon for providing the needed protection when there is an ESD event. One of the problems is that the triggering of the snap-back is not always uniform so that many of the transistors of the total number of transistors that are in parallel do not actually experience the snap-back which results in a degradation in performance in properly discharging the ESD event. The result is the transistor needs to be bigger than otherwise would be needed if all of the inherent BJTs were ensured of reaching the snap-back condition.

Accordingly there is a need to provide further improvement in achieving snap-back in inherent BJTs in providing protection for temporary high voltage events such as ESD events.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a voltage protection device for an integrated circuit has a MOS transistor, made up of many transistors in parallel, coupled between two terminals in which the two terminals, when coupled together, aid in providing voltage protection to the integrated circuit. One terminal is for receiving a voltage greater than the other terminal. An inherent bipolar junction transistor (BJT), made up of individual BJTs for each of the MOS transistors in parallel, is provided with additional current by use of a structure periodically introduced in the MOS transistors in parallel to ensure there is enough base current to induce snap-back. The structure includes three regions in parallel in which the middle region is a different conductivity type from that of the two outer regions.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
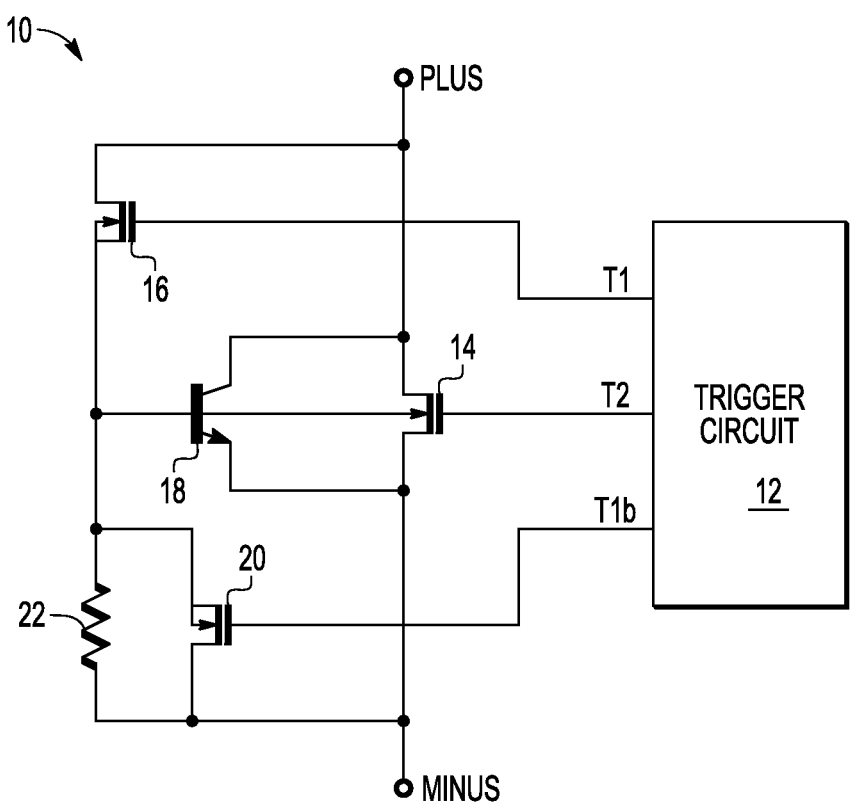
FIG. 1 is a circuit diagram of a voltage protection circuit according to a first embodiment.

Shown in FIG. 1 is a voltage protection circuit 10 comprising a trigger circuit 12, an N channel transistor 14, an N channel transistor 16, an NPN bipolar junction transistor (BJT) 18, an N channel transistor 20, and a resistance 22 shown in the form of a resistor. Transistors 14 and 18 are each made up of multiple transistors in parallel. Transistor 18 may be an inherent BJT of transistor 14. Trigger circuit 12 has outputs for providing a trigger signal T1, a trigger signal T2, and a complementary trigger signal T1b. Transistor 14 has a gate connected to trigger circuit 12 for receiving trigger signal T2, a drain connected to a plus terminal, a source connected to a minus terminal, and a body terminal. Transistor 16 has a gate connected to trigger circuit 12 for receiving trigger signal T1, a drain connected to the plus terminal, and a source and a body connected to the body of transistor 14. Transistor 18 has a collector connected to the drain of transistor 14, a base connected to the body of transistor 14, and an emitter connected to the minus terminal. Transistor 20 has a gate connected to trigger circuit 12 for receiving complementary trigger signal T1b, a drain and a body connected to the body of transistor 14, and a source connected to the minus terminal. Resistance 22 is between the body of transistor 14 and the minus terminal. Voltage protection circuit 10 is for the case where the voltage at the plus terminal is greater than the voltage at the minus terminal. The minus terminal may be ground, for example, while the plus terminal may be a positive power supply terminal or a bus especially for voltage protection. Trigger signals T1 and T2 carry the same information but are on different outputs. It may be effective for trigger signal T2 to be driven to a different voltage level than trigger signal T1 or for trigger signal T2 to remain at a constant voltage level. It would be expected that the number of transistors in parallel would be much greater in number for transistor 14 than for transistor 16 and thus the capacitive loading would be much greater on trigger signal T2. By providing trigger signal T1 separately from signal T2, the degradation of trigger signal T2 due to capacitance does not result in a significant degradation of performance whereas a degradation of trigger signal T1 would. It may be effective for trigger signals T1 and T2 to be combined into a single trigger signal.

In the absence of a high voltage event such as an ESD event, trigger circuit 12 provides trigger signals T1 and T2 at a logic low so that transistors 14 and 16 are non-conductive and complementary trigger signal Tb at a logic high so that transistor 20 is conductive. A high voltage event is one that has the potential for overstressing the integrated circuit to the point of damaging at least some portion of it and may be called an overstress event. With transistor 20 conductive, the body of transistor 14 is coupled to the minus terminal ensuring that NPN transistor 18 does not conduct current in the absence of a high voltage event. Also when transistor 20 is conductive, latch-up involving transistor 18 is made more difficult. It may, however, also be effective for transistor 20 to be missing and resistor 22 alone ensure that the body of transistor 14 is coupled to the minus terminal in the absence of a high voltage event. It may be effective for resistor 22 to be missing and transistor 20 alone ensure that the body of transistor 14 is coupled to the minus terminal in the absence of a high voltage event. It may also be effective for both the resistor 22 and the transistor 20 to be missing effectively leaving the body of transistor 14 floating in the absence of a high voltage event. Transistor 20 of FIG. 1 further reduces the resistance between the body of transistor 14 and the minus terminal, making it harder for the NPN transistor 18 to enter snap back conduction in the absence of a high voltage event.

Upon the occurrence of a high voltage event, trigger signals T1 and T2 switch to a logic high causing transistors 14 and 16 to become conductive, and complementary trigger signal T1b switches to a logic low causing transistor 20 to become non-conductive. Transistor 14 becoming conductive couples the plus terminal to the minus terminal and causing relatively high current to flow between these terminals. This produces impact ionization in the channel region of transistor 14 close to the drain-body junction, with the impact ionization current adding to the base current of the inherent NPN transistor 18 and causing conditions favorable to snap back of transistor 18. Transistor 16 being conductive provides additional base current for NPN transistor 18 and thereby ensures that transistor 18 snaps back. For each transistor in parallel that forms transistor 14 there is a corresponding bipolar transistor which may or may not reach snap back and so the periodic presence of transistor 16 increases the base current into the bipolar transistors and thus ensures that all NPN transistors in parallel enter snap back conduction. Having a shared well is helpful in this regard.

Figure 2:
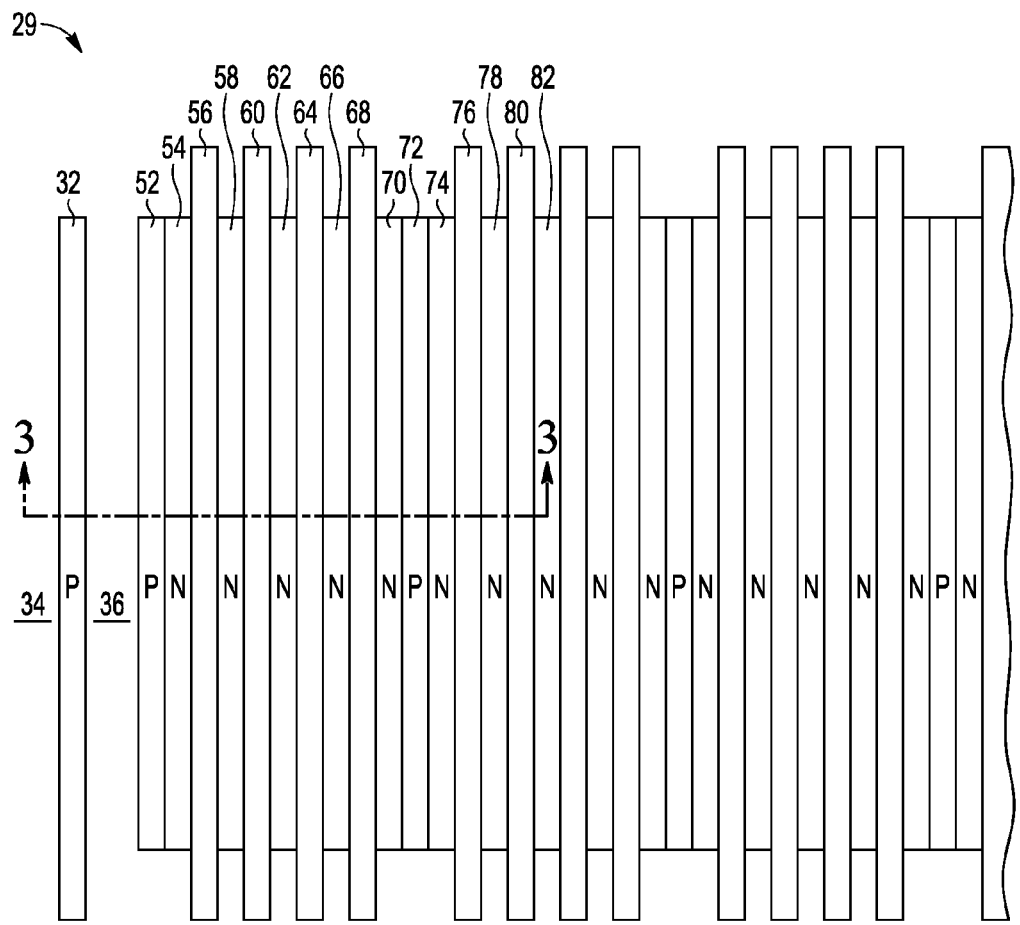
FIG. 2 is a top view of a device structure useful in making the circuit of FIG. 1.

Shown in FIG. 2 is a top view of a device structure 29 useful in making circuit 10 comprising doped regions 32, 52, 54, 58, 62, 66, 70, 72, 74, 78, 82, and many more similar regions; gate electrodes 56, 60, 64, 68, 76, 80, and many more similar gate electrodes; and isolation regions 34 and 36. Doped regions 32, 52, and 72 are p type. Doped region 32 is between isolation regions 34 and 36. Doped regions 54, 58, 62, 66, 70, 74, 78, and 82 are n type and are either source regions or drain regions. Doped regions 32, 52, and 72 are body contacts for this example in which the body is p type. Doped region 52 and doped region 54 are abutting. Doped region 72 is abutted by region 70 on one side and by region 74 on the other side. Gate electrode 56 is between doped regions 54 and 58. Gate electrode 60 is between doped regions 58 and 62. Gate electrode 64 is between doped regions 62 and 66. Gate electrode 68 is between doped regions 66 and 70. Gate electrode 76 is between doped regions 74 and 78. Gate electrode 80 is between doped regions 78 and 82. Gate 84 is also between doped regions in which doped region 82 is on one side. Doped regions 32, 52, 54, 58, 62, 66, 70, 72, 74, 78, 82 are relatively long and narrow to result in large channel widths.

Figure 3:
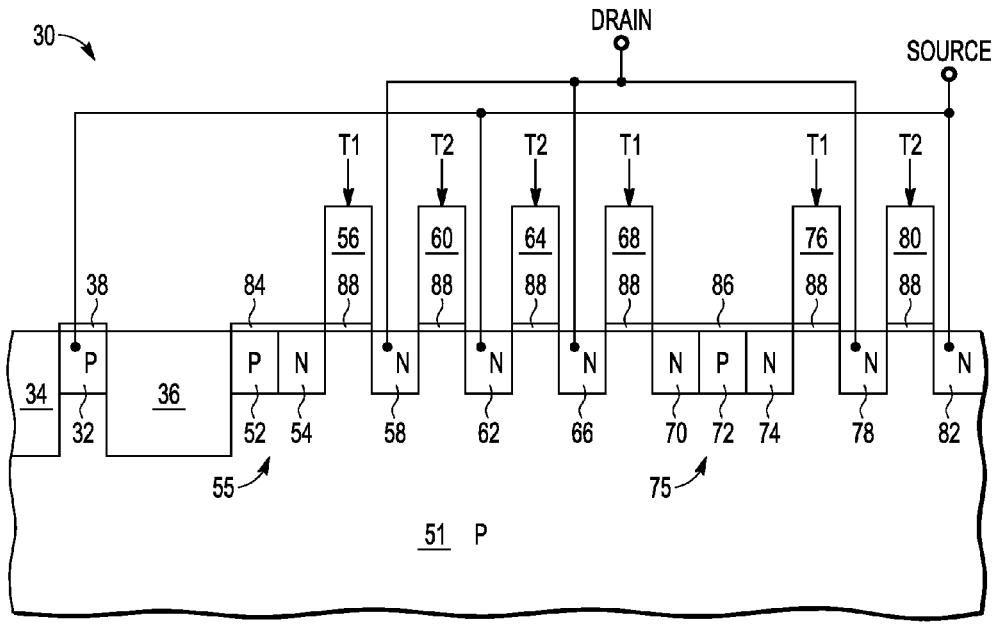
FIG. 3 is a cross section of the device structure of FIG. 2 connected to achieve a function useful in the circuit of FIG. 1.

Shown in FIG. 3 is a cross section 3-3 of FIG. 2 depicting connections resulting in a configuration 30. Shown also are the doped regions formed in a substrate 51 that is p type. Gate electrodes 56, 60, 64, 68, 76, and 80 have gate dielectrics 88 between them and substrate 51. Doped regions 52 and 54 are connected together by a silicide region 84 that overlies doped regions 52 and 54. Doped regions 52 and 54 are abutting and referenced as abutting fingers 55. Doped regions 70, 72, and 74 are similarly abutting and connected together by an overlying silicide region 86. Doped regions 70, 72, and 74 are referenced as abutting fingers 75. Doped regions 58, 66, and 78 are shown connected together as portions of the drain of transistor 14 as well as portions of the collector of NPN transistor 18. Doped regions 62 and 82 are connected together as portions of the source of transistor 14 as well as portions of the emitter of NPN transistor 18. The source of transistor 14 is also connected to doped region 32 which serves as a resistive body tie of transistors 14 and 16 and as a resistive base tie of NPN device 18. The cumulative resistance between the individual transistors that make up transistors 14 and 16 and doped region 32 is represented by resistance 22 as shown in FIG. 1. In the configuration shown in FIG. 3, transistor 20 of FIG. 1 is not formed. Doped regions 52 and 54 form one portion of the source of transistor 16. Doped regions 70, 72, and 74 form another portion of the source of transistor 16. Gates 56, 68, and 76 receive trigger signal T1. Gates 60, 64, and 80 receive trigger signal T2. Between each pair of doped regions that are used to form transistor 14 is the inherent BJT that is useful for providing additional current through snap back.

When a high voltage event is detected by trigger circuit 12, trigger signals T1 and T2 switch from a logic low to a logic high which causes high current to flow through transistor 14, which includes current passing from doped region 66 to doped region 62. Impact ionization in the conducting channel of transistor 14 causes current to flow into the body, substrate 51 below the channel between doped regions 62 and 66. This body current flows towards the resistive body tie, doped region 32, causing a voltage drop along its path to the body tie and locally raising the potential of the body region under the MOSFET channel between doped regions 66 and 62, which is also the base region of the inherent NPN 18. Similarly, the local body potentials of other portions of transistor 14, for example the region between doped regions 58 and 62 or between the doped regions 78 and 82, are raised as well. To aid this local change in body potential, which in this example is an increase, transistor 16 having gate 56, among others, passes current from doped region 58 into the body through doped region 54, which is shorted to doped region 52 through silicide 84. With doped region 52 being p type, there is a current path from doped region 54 to the p-type body. Similarly, current is injected into the body through doped region 72 with the transistors of gates 68 and 76, which are portions of transistor 16, being conductive so that current is passing from doped region 66 to doped region 70 and from doped region 78 to doped region 74. Thus the gate of transistor 16 is controlled in a manner that beneficially changes the voltage potential of the local body regions for transistor 14 which, for example, are those below gates 60, 64, and 80. In this case the beneficial change is an increase in voltage potential. The combination of the current injected into the body through impact ionization and the current injected by transistor 16 raises the local base potential of NPN device 18 enough to cause snap back. Because the snap back current of NPN transistor 18 occurs further below the surface of substrate 51 and typically in a much larger region than does the channel current of transistor 14, there is much greater current carrying capacity before destructive overheating occurs. When the current due to the high voltage event finally dissipates, transistor 18 will automatically become non-conductive. Trigger circuit 12 will detect that the high voltage event is finished and trigger signals T1 and T2 will both switch back to a logic low. In this example, shown in FIG. 3, three gates receive trigger signal T2 and three gates receive trigger signal T1, which is to simplify the drawing. In practice, more transistors would receive trigger signal T2 than would receive trigger signal T1. The ratio would be determined experimentally based upon the particular process and also the particular requirements of the high voltage protection. Other factors may come into play as well.

Figure 4:
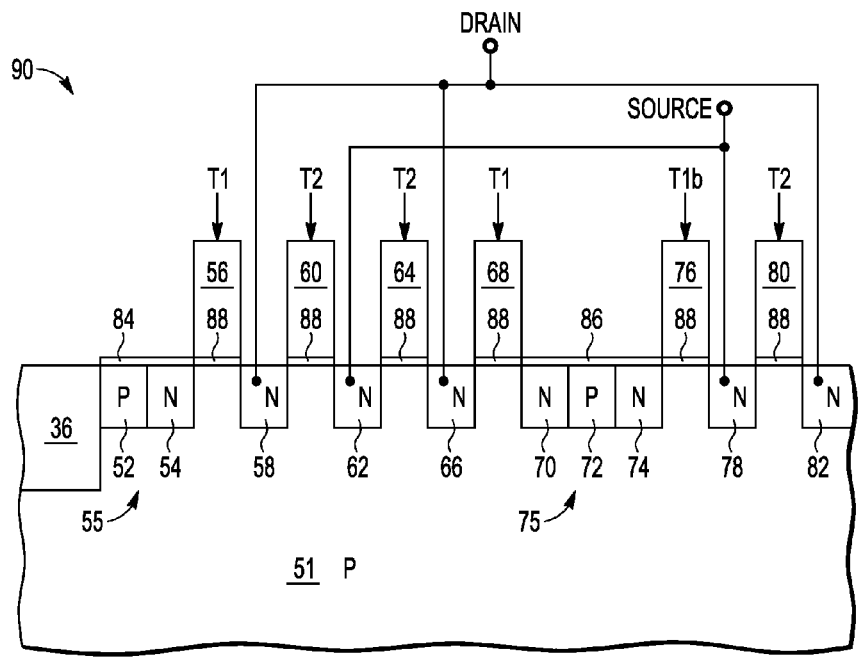
FIG. 4 is a cross section of the device structure of FIG. 2 connected to achieve a a different function than that shown in FIG. 3 useful in the circuit of FIG. 1.

Shown in FIG. 4 is a configuration 90 for the cross section 3-3 shown in FIG. 2. The portion of cross section 3-3 not relevant to configuration 90 is not shown in FIG. 4. In configuration 90, doped regions 58, 66, and 82 are connected together and are portions of the drain of transistor 14, doped regions 62 and 78 are connected together and are portions of the source of transistor 14, and gates 60, 64, and 80 receive trigger signal T2 and are portions of the gate of transistor 14. Gates 56 and 68 receive trigger signal T1 and are portions of the gate of transistor 16. Doped regions 58 and 66 are portions of the drain of transistor 16 as well as for transistor 14. Doped regions 54 and 70 are portions of the source of transistor 16 and are connected to the body as described for configuration 30 of FIG. 3. Gate 76 receives complementary trigger signal T1b and is a portion of the gate of transistor 20. Doped region 78 is a portion of the source of transistor 20. Doped region 74 is a portion of the drain of transistor 20. Thus, in the absence of a high voltage event, complementary trigger signal T1b is a logic high which keeps transistor 20 conductive ensuring that the body is shorted to the minus terminal through doped regions 72, 74, and 78. Doped region 78 is a portion of the source node of transistor 14 and thus connected to the minus terminal as shown in FIG. 1. Doped region 72, being p type, is electrically connected to substrate 51, which is continuous with the body of each of the transistors that form transistors 14, 16, and 20. This keeps the body of each of the transistors from floating when there is no high voltage event. When a high voltage event occurs, gates 56, 60, 64, 68, and 80 switch to a logic high. Thus all of the transistors that form transistors 14 and 16 become conductive. The operation is the same as for configuration 30 of FIG. 3 except that one of the transistors shown for forming transistor 16 for configuration 30 is the transistor in FIG. 4 that is for forming transistor 20 in FIG. 1. For example, gate 76, shown in FIG. 4, is used in forming transistor 20. Whereas gate 76, shown in FIG. 3, is used in forming transistor 16. The transistors that are used to form transistor 16 make transistor 16 sufficiently large to ensure that snap back occurs for each of the inherent bipolar transistors associated with transistor 14 that form bipolar transistor 18. As shown in FIG. 4, three gates receive trigger signal T2, two receive trigger signal T1, and one receives complementary trigger signal T1b. Thus the ratio as shown in FIG. 4 is 3:2:1 for transistors 14, 16, and 20. This ratio is for simplicity. The actual ratio will be greater than this for transistor 14. The ratio will need to be determined experimentally based on the process and the high voltage event conditions. Other factors may come into play as well.

Figure 5:
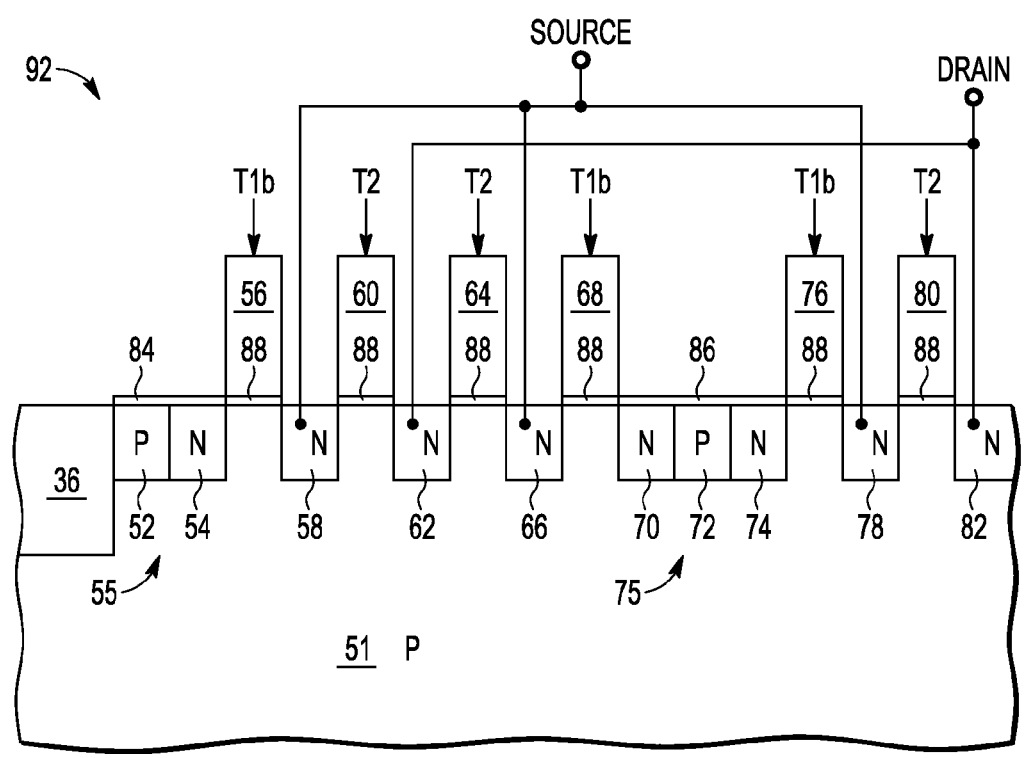
FIG. 5 is a cross section of the device structure of FIG. 2 connected to achieve a a different function than that shown in FIG. 3 or FIG. 4 useful in the circuit of FIG. 1.

Shown in FIG. 5 is a configuration 92 for cross section 3-3 of FIG. 2. The portion of cross section 3-3 not relevant to configuration 92 is not shown in FIG. 5. In this configuration doped regions 58, 66, and 78 are connected as portions of the source of transistor 14, doped regions 62 and 82 are connected as portions of the drain of transistor 14, and gates 60, 64, and 80 receive trigger signal T2. Doped regions 54, 70, and 74 are portions of the drain of transistor 20; doped regions 58, 66, and 78 form portions of the source of transistor 20; and gates 56, 68, and 76 receive complementary trigger signal T1b. In this configuration of the limited portion shown, transistor 16 portions are not shown and may be formed in a different location than that shown in FIG. 5. In this location, three gates receive complementary signal T1b and these transistors receiving this signal and forming transistor 20 are useful in keeping substrate 51 and the body regions of the transistors forming transistor 16 at a stable voltage during normal operation of the integrated circuit. Thus, in absence of an overstress event, the body regions of transistor 16 are controlled in a manner that impedes a voltage change in those body regions and thereby the body regions are maintained at a low voltage potential. When trigger signal T2 switches to a logic high in response to a high voltage event, transistor 14 becomes conductive and the assist provided by transistor 16 to inherent transistor 18 to achieve snap back would be provided outside of what is shown in FIG. 5. It may be effective to use the configuration 92 without transistor 16, for example if the resistor 22 is relatively large and the snap back condition of transistor 18 is reached entirely by the drain junction leakage or impact ionization current provided by transistor 14.

Thus a structure for achieving the circuit of FIG. 1 which provides assist to snap back for an inherent bipolar transistor can be connected in multiple ways to achieve the desired functionality.

By now it should be appreciated that there has been provided an integrated circuit electrical protection device including a semiconductor substrate. The device further includes first, second, and third doped regions of a first polarity in the semiconductor substrate, wherein the first and second doped regions are separated from one another by a first body region having a second polarity in the semiconductor substrate and the second and third doped regions are separated from one another by a second body region having the second polarity in the semiconductor substrate, wherein the first and second polarities are different from one another. The device further includes a fourth doped region of the second polarity in the semiconductor substrate, wherein the fourth doped region directly abuts and is in contact with the third doped region. The device further includes a first gate structure formed on the semiconductor substrate over the first body region between the first and second doped regions. The device further includes a second gate structure formed on the semiconductor substrate over the second body region between the second and third doped regions, wherein when the second gate structure is activated, an electric potential in the first body region is controlled by establishing a conductive path between the first body region and the second doped region through the substrate via the third and fourth doped regions and a conductive channel in the second body region. The device may further include a layer of conductive material over the third and fourth doped regions and electrically coupling the third doped region to the fourth doped region. The device may further include one of a group consisting of the first doped region is a source and the second doped region is a drain and the first doped region is a drain and the second doped region is a source. The device may have a further characterization by which the first polarity is an N polarity and the second polarity is a P polarity, wherein when the second gate structure is activated, the electric potential in the first body region is elevated. The device may have a further characterization by which the first polarity is an N polarity and the second polarity is a P polarity, wherein when the second gate structure is activated, the electric potential in the first body region is maintained at a low voltage potential. The device may have a further characterization by which the first and second gate structures are driven to a same logic level. The device may have a further characterization by which the first gate structure is driven to a first logic level and the second gate structure is driven to second logic level that is opposite the first logic level. The device may have a further characterization by which the first doped region is coupled to a first voltage supply rail and the second doped region is coupled to a second voltage supply rail. The device may further include comprising a trigger circuit configured to detect electrical overstress events and to control the first and second gate structures. The device may further include a resistor coupled between the first doped region and the first body region. The device may further include a fifth doped region of the second polarity that couples the first body region to the first doped region via the substrate.

Disclosed also is a voltage protection device having a semiconductor substrate. The device further includes a first metal oxide semiconductor field effect transistor (MOSFET) including a first doped region and a second doped region formed in the semiconductor substrate and a first gate structure formed over a first body region of the semiconductor substrate between the first and second doped regions. The device further includes a second MOSFET including the second doped region and a third doped region formed in the semiconductor substrate and a second gate structure formed over a second body region of the semiconductor substrate between the second and third doped regions. The device further includes a fourth doped region in the semiconductor substrate formed directly adjacent to and in contact with the third doped region, wherein the fourth doped region has a first polarity that is different than a second polarity of the first, second and third doped regions, and when the second MOSFET is in conductive mode, an electric potential in the first body region is controlled by establishing a conductive path between the first body region and the second doped region through the substrate via the second MOSFET, the third doped region, and the fourth doped region. The device may have a further characterization by which the first polarity is an N polarity and the second polarity is a P polarity, wherein when the second MOSFET is in conductive mode, the electric potential in the first body region is elevated. The device may have a further characterization by which the first polarity is an N polarity and the second polarity is a P polarity, wherein when the second MOSFET is in conductive mode, the first body region is maintained at a low voltage potential. The device may have a further characterization comprising one of a group consisting of the first and second gate structures are driven to a same logic level and the first gate structure is driven to a first logic level and the second gate structure is driven to second logic level that is opposite the first logic level. The device may further include a resistor coupled between the first doped region and the first body region, wherein the first doped region is coupled to a first voltage supply rail and the second doped region is coupled to a second voltage supply rail. The device may further include a fifth doped region of the second polarity that couples the first body region to the first doped region via the substrate.

Also disclosed is a method of making of operating an integrated circuit device having first and second MOSFETs using a substrate. The method further includes controlling a first gate structure of the first MOSFET and a second gate structure of the second MOSFET to control a voltage potential in a first body region of the integrated circuit device by coupling the first body region of the first MOSFET to a second doped region through the substrate via the second MOSFET, a third doped region, and a fourth doped region. The method has further characterization by which the first gate structure and the first and second doped regions are part of the first MOSFET. The method has further characterization by which the second gate structure and the second and third doped regions are part of the second MOSFET. The method has further characterization by which the fourth doped region is positioned directly in contact with the third doped region. The method has further characterization by which a polarity of the first, second, and third doped regions is opposite a polarity of the fourth doped region. The method may have further characterization by which the controlling the first and second gate structures changes the voltage potential of the first body region in response to an overstress event. The method may have further characterization by which the controlling the first and second gate structures maintains the voltage potential of the first body region at a low voltage potential in absence of an overstress event.

Although the invention is described herein with reference to specific embodiments, various modifications and changes can be made without departing from the scope of the present invention as set forth in the claims below. For example, the change in body potential is described as an increase but may, in the proper situation, be a decrease. For example, the conductivity types of the various doped regions may be able to be reversed to obtain analogous operation but using P type transistors and PNP inherent bipolar transistors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit electrical protection device comprising:
   a semiconductor substrate;
   first, second, and third doped regions of a first polarity in the semiconductor substrate, wherein the first and second doped regions are separated from one another by a first body region having a second polarity in the semiconductor substrate and the second and third doped regions are separated from one another by a second body region having the second polarity in the semiconductor substrate, wherein the first and second polarities are different from one another, and wherein the first body region has an electric potential;

a fourth doped region of the second polarity in the semiconductor substrate, wherein the fourth doped region directly abuts and is in contact with the third doped region;

a first gate structure formed on the semiconductor substrate over the first body region between the first and second doped regions; and a second gate structure formed on the semiconductor substrate over the second body region between the second and third doped regions, the second gate structure having an active state such that when the second gate structure is in the active state, the electric potential is controlled by a conductive path between the first body region and the second doped region through the substrate via the third and fourth doped regions and a conductive channel in the second body region.

2. The device of claim 1, further comprising:
a layer of conductive material over the third and fourth doped regions and electrically coupling the third doped region to the fourth doped region.

3. The device of claim 1, having a further characterization comprising:
one of a group consisting of:
the first doped region is a source and the second doped region is a drain, and
the first doped region is a drain and the second doped region is a source.

4. The device of claim 1, wherein:
the first polarity is an N polarity; and
the second polarity is a P polarity, wherein when the second gate structure is activated, the electric potential in the first body region is elevated.

5. The device of claim 1, wherein:
the first polarity is an N polarity;
the second polarity is a P polarity, wherein when the second gate structure is activated, the electric potential in the first body region is maintained at a low voltage potential.

6. The device of claim 1, wherein the first and second gate structures are driven to a same logic level.

7. The device of claim 1, wherein the first gate structure is driven to a first logic level and the second gate structure is driven to second logic level that is opposite the first logic level.

8. The device of claim 1, further comprising a trigger circuit configured to detect electrical overstress events and to control the first and second gate structures.

9. The device of claim 1, further comprising a resistor coupled between the first doped region and the first body region.

10. The device of claim 1, further comprising a fifth doped region of the second polarity that couples the first body region to the first doped region via the substrate.

11. The device of claim 1, wherein the first doped region is coupled to a first voltage supply rail and the second doped region is coupled to a second voltage supply rail.

12. A voltage protection device, comprising:
a semiconductor substrate;
a first metal oxide semiconductor field effect transistor (MOSFET) including a first doped region and a second doped region formed in the semiconductor substrate and a first gate structure formed over a first body region of the semiconductor substrate between the first and second doped regions, wherein the first body region has an electric potential;

a fourth doped region in the semiconductor substrate formed directly adjacent to and in contact with the third doped region, wherein the fourth doped region has a first polarity that is different than a second polarity of the first, second and third doped regions; and a second MOSFET including the second doped region and a third doped region formed in the semiconductor substrate and a second gate structure formed over a second body region of the semiconductor substrate between the second and third doped regions; the second MOSFET having a conductive state such that when the MOSFET is in the conductive state, the electric potential is controlled by a conductive path between the first body region and the second doped region through the substrate via the second MOSFET, the third doped region, and the fourth doped region.

13. The device of claim 12, wherein:
the first polarity is an N polarity;
the second polarity is a P polarity, wherein when the second MOSFET is in conductive mode, the electric potential in the first body region is elevated.

14. The device of claim 12, wherein:
the first polarity is an N polarity;
the second polarity is a P polarity, wherein when the second MOSFET is in conductive mode, the first body region is maintained at a low voltage potential.

15. The device of claim 12, further comprising a further characterization of a group consisting of:
the first and second gate structures are driven to a same logic level; and
the first gate structure is driven to a first logic level and the second gate structure is driven to second logic level that is opposite the first logic level.

16. The device of claim 12, further comprising a resistor coupled between the first doped region and the first body region, wherein the first doped region is coupled to a first voltage supply rail and the second doped region is coupled to a second voltage supply rail.

17. The device of claim 12, further comprising a fifth doped region of the second polarity that couples the first body region to the first doped region via the substrate.

18. A method of making of operating an integrated circuit device having first and second MOSFETs using a substrate, comprising:
controlling a first gate structure of the first MOSFET and a second gate structure of the second MOSFET to control a voltage potential in a first body region of the integrated circuit device by coupling a first body region of the first MOSFET to a second doped region through the substrate via the second MOSFET, a third doped region, and a fourth doped region, wherein
the first gate structure and the first and second doped regions are part of the first MOSFET,
the second gate structure and the second and third doped regions are part of the second MOSFET,
the fourth doped region is positioned directly in contact with the third doped region, and
a polarity of the first, second, and third doped regions is opposite a polarity of the fourth doped region.

19. The method of claim 18, wherein:
the controlling the first and second gate structures changes the voltage potential of the first body region in response to an overstress event.

20. The method of claim 18, wherein:
the controlling the first and second gate structures impedes change in the voltage potential of the first body region in absence of an overstress event.

* * * * *